(12) United States Patent
Liu

(10) Patent No.: US 11,038,139 B2
(45) Date of Patent: Jun. 15, 2021

(54) ORGANIC ELECTROLUMINESCENT DEVICES, DISPLAYS AND MOBILE COMMUNICATION DEVICES

(71) Applicant: KunShan Go-Visionox Opto-Electronics Co., Ltd., Jiangsu (CN)

(72) Inventor: Mingxing Liu, Jiangsu (CN)

(73) Assignee: KUNSHAN GO-VISIONOX OPTO-ELECTRONICS CO., LTD, Jiangsu (CN)

( * ) Notice: Subject to any disclaimer, the term of this patent is extended or adjusted under 35 U.S.C. 154(b) by 49 days.

(21) Appl. No.: 16/426,569

(22) Filed: May 30, 2019

(65) Prior Publication Data
US 2019/0334109 A1      Oct. 31, 2019

Related U.S. Application Data

(63) Continuation of application No. PCT/CN2018/103003, filed on Aug. 29, 2018.

(30) Foreign Application Priority Data

Oct. 31, 2017 (CN) .......................... 201711053156.6

(51) Int. Cl.
*H01L 51/52* (2006.01)
*H01L 27/32* (2006.01)

(52) U.S. Cl.
CPC ........ *H01L 51/5203* (2013.01); *H01L 27/326* (2013.01); *H01L 27/3246* (2013.01); *H01L 27/3248* (2013.01); *H01L 2251/53* (2013.01)

(58) Field of Classification Search
CPC ............. H01L 51/5203; H01L 27/3246; H01L 27/3248; H01L 27/326; H01L 2251/53
See application file for complete search history.

(56) References Cited

U.S. PATENT DOCUMENTS

| 10,608,060 B2 * | 3/2020 | Kim ................... H01L 29/41733 |
| 2017/0047391 A1 * | 2/2017 | You ..................... H01L 29/78606 |
| 2017/0338295 A1 * | 11/2017 | Lee ....................... H01L 27/3276 |
| 2018/0331124 A1 * | 11/2018 | Cho ...................... H01L 27/3276 |

FOREIGN PATENT DOCUMENTS

| CN | 102082238 B | 3/2013 |
| CN | 104681587 A | 6/2015 |
| CN | 104752439 A | 7/2015 |

(Continued)

OTHER PUBLICATIONS

CN 104752439 A _ Espacenet English Abstract.

(Continued)

*Primary Examiner* — Mark W Tornow
(74) *Attorney, Agent, or Firm* — Ladas & Parry LLP

(57) ABSTRACT

Exemplary embodiments of the disclosure disclose an organic electroluminescent device including a display area, a non-display area, an isolation area and a first overlapping area. The non-display area is located at the periphery of the display area. The isolation area is located between the display area and the non-display area. The first overlapping area has a first electrode located in the isolation area and a second electrode overlapped with the first electrode in the isolation area.

20 Claims, 4 Drawing Sheets

(56) References Cited

FOREIGN PATENT DOCUMENTS

| | | |
|---|---|---|
| CN | 105244365 A | 1/2016 |
| CN | 105977273 A | 9/2016 |
| CN | 107871776 A | 4/2018 |
| TW | 201801369 A | 1/2018 |

OTHER PUBLICATIONS

CN 104681587 A _ Espacenet English Abstract.
CN 102082238 B _ Espacenet English Abstract.
International Search Report in International Application No. PCT/CN2018/103003.
Written Opinion of the International Search Authority in International Application No. PCT/CN2018/103003.
CN 107871776 A _ Espacenet_English_Abstract.
CN 105977273 A _ Espacenet_English_Abstract.
CN 105244365 A _ Espacenet_English_Abstract.
TW 201801369 A _ Espacenet_English_Abstract.

* cited by examiner

ORGANIC ELECTROLUMINESCENT DEVICES, DISPLAYS AND MOBILE COMMUNICATION DEVICES

CROSS REFERENCE

This application is a continuation of International Application No. PCT/CN2018/103,003, filed on Aug. 29, 2018, which claims priority to Chinese Patent Application No. 201711053156.6, entitled "ORGANIC ELECTROLUMINESCENT DEVICES, DISPLAYS AND MOBILE COMMUNICATION DEVICES" filed on Oct. 31, 2017, the contents of which are expressly incorporated by reference herein in their entireties.

FIELD OF THE DISCLOSURE

Exemplary embodiments of the disclosure relate to organic electroluminescent devices, and in particular to organic electroluminescent devices, displays and mobile communication devices.

BACKGROUND

An Organic Light Emitting Diode (OLED for short), as a current-type light-emitting device, is increasingly used in the field of high performance display owing to its many features, such as self luminous, fast response, wide viewing angle, and manufacturability that can be fabricated on a flexible substrate.

With extension of applications of OLEDs in the display field and requirements for appearance of hand-held mobile devices, a frame size of the OLED display is also relatively reduced. However, when the size of the frame is reduced, trace space of a lead is also reduced, which makes the lead layout difficult. The reduced space also affects the width of the lead. The lead with insufficient width is prone to current attenuation at the end of the lead, resulting in the problem of uneven display of the display.

SUMMARY

In view of the above, the technical problem to be solved by exemplary embodiments of the disclosure is the problem of the insufficient lead space of the organic electroluminescent device in the overlapping area, and the problem of the uneven luminance of the screen due to insufficient lead space. Exemplary embodiments of the disclosure provide organic electroluminescent devices, displays, and mobile communication devices.

The above object of exemplary embodiments of the disclosure can be achieved by the following technical solution:

An organic electroluminescent device, comprising:
a display area;
a non-display area located at the periphery of the display area;
an isolation area located between the display area and the non-display area, and the isolation area having a first overlapping area; a first electrode located in the isolation area; a second electrode overlapped with the first electrode; the first electrode being overlapped with the second electrode in the first overlapping area.

The organic electroluminescent device further comprises a third electrode, the non-display area comprises a second overlapping area, and the third electrode is overlapped with the second electrode in the second overlapping area.

The third electrode in the second overlapping area is formed by extending from the first electrode in the isolation area toward the non-display area.

The organic electroluminescent device further comprises a substrate and a planarization layer arranged on the substrate, and the first electrode and the third electrode are formed on the planarization layer.

The organic electroluminescent device further comprises a pixel defining, layer arranged on the planarization layer and the pixel defining layer further comprises a plurality of pixel defining blocks for defining the display area and the isolation area, the isolation area and the non-display area.

The organic electroluminescent device further comprises an organic layer formed on the first electrode.

The organic electroluminescent device further comprises an isolation column arranged on the pixel defining layer, and the second electrode covers the isolation column.

The planarization layer comprises a plurality of grooves in the isolation area and/or the non-display area, the first electrode or the third electrode fills the grooves, or the first electrode and the third electrode fill the grooves.

The organic layer has a plurality of openings, and the first electrode is in electrical communication with the second electrode via the opening; the substrate has a first side and a second side opposite to the first side, the first side is one side close to an integrated circuit wire bonding area of the substrate, and the second side is the other side far away from the integrated circuit wire bonding area of the substrate.

The organic electroluminescent device further comprises a plurality of conductive pillars arranged in the plurality of openings, the plurality of conductive pillars are overlapped with the first electrode, and the second electrode are overlapped with the plurality of conductive pillars.

A setting density of the plurality of openings in the organic layer is increased in the direction from the first side of the substrate toward the second side of the substrate.

A spaced distance between the plurality of openings is reduced in the direction from the first side of the substrate toward the second side of the substrate.

An area of the plurality of openings in the organic layer is increased in the direction from the first side of the substrate toward the second side of the substrate.

A film thickness of the second electrode in the isolation area is increased in the direction from the first side of the substrate to the second side of the substrate of the organic electroluminescent display; the first side is one side close to an integrated circuit wire bonding area of the substrate, and the second side is the other side far away from the integrated circuit wire bonding area of the substrate.

Exemplary embodiments of the disclosure also comprise an organic electroluminescence display comprising a flexible printed circuit board (FPC) and a power supply interface, and using the organic electroluminescent device mentioned above.

Exemplary embodiments of the disclosure also comprise a mobile communication device comprising a communication device and a display device being the organic electroluminescent display mentioned above.

Compared with the prior art, the third electrode is formed by making the first electrode of the first overlapping area in the isolation area extend to the second overlapping area in the non-display area. When the current narrow bezel design reduces a space for the non-display area, the area of the first electrode can be effectively increased, thereby compensating for the problem of insufficient overlapping area when designing the narrow bezel by making the overlapping area of the electrodes extend to the isolation area. By means of increasing the area mentioned above, the parasitic resistance of the first electrode achieves the effect of the reduced resistance by parallel connection. When the current flows, the problem of current attenuation can be further alleviated, and the uneven display defect of the organic electroluminescent display can be improved.

In the organic electroluminescent device of exemplary embodiments of the disclosure, the first electrode fill the plurality of grooves in the planarization layer to increase the volume of the first electrode, and the parasitic resistance of the first electrode is also relatively decreased after the parallel connection resulting in the added volume. In the embodiment, by means of increasing the volume mentioned above, the parasitic resistance of the first electrode achieves the effect of the reduced resistance by parallel connection. When the current flows, the problem of current attenuation can be further alleviated, and the uneven display defect of the organic electroluminescent display can be improved.

The organic electroluminescent device of exemplary embodiments of the disclosure, by means of the first electrode overlapped with the second electrode, can form an electrode layer with a larger area or a larger volume, so that the parasitic resistance achieves the effect of the reduced resistance by parallel connection by means of an overlapping way, thereby further alleviating the problem of current attenuation and improving the uneven defect of the organic electroluminescent display.

The organic electroluminescent device of exemplary embodiments of the disclosure, by means of adding the setting density of the openings, shortening the spaced distance between the openings and increasing the area of opening, can further increase the overlapping area between the first electrode and the second electrode, so that the parasitic resistance of the first electrode and the second electrode achieves the effect of the reduced resistance by parallel connection, thereby further alleviating the problem of current attenuation and improving the uneven defect of the organic electroluminescent display.

The organic electroluminescent device of exemplary embodiments of the disclosure, by means of progressively increasing the thickness of the second electrode, can achieve the effect of reducing the resistance of the parasitic resistance of the second electrode, thereby further alleviating the problem of current attenuation and improving the uneven defect of the organic electroluminescent display.

The implementation of any one of the products of exemplary embodiments of the disclosure does not necessarily require all of the technical effects described above to be achieved at the same time.

BRIEF DESCRIPTION OF THE DRAWINGS

The drawings described herein are provided for further understanding the disclosure and as a part of the disclosure. The exemplary embodiments of the disclosure and description thereof are used to explain the disclosure and not as any improper limitation to the disclosure. In the drawings.

DETAILED DESCRIPTION OF PREFERRED EMBODIMENTS

Exemplary embodiments of the disclosure will be described below in detail with reference to the accompanying drawings and examples, thus how to solve the technical problems by applying the technical means and the implementation process to achieve the technical effect can be fully understood and implemented.

Figure 1:
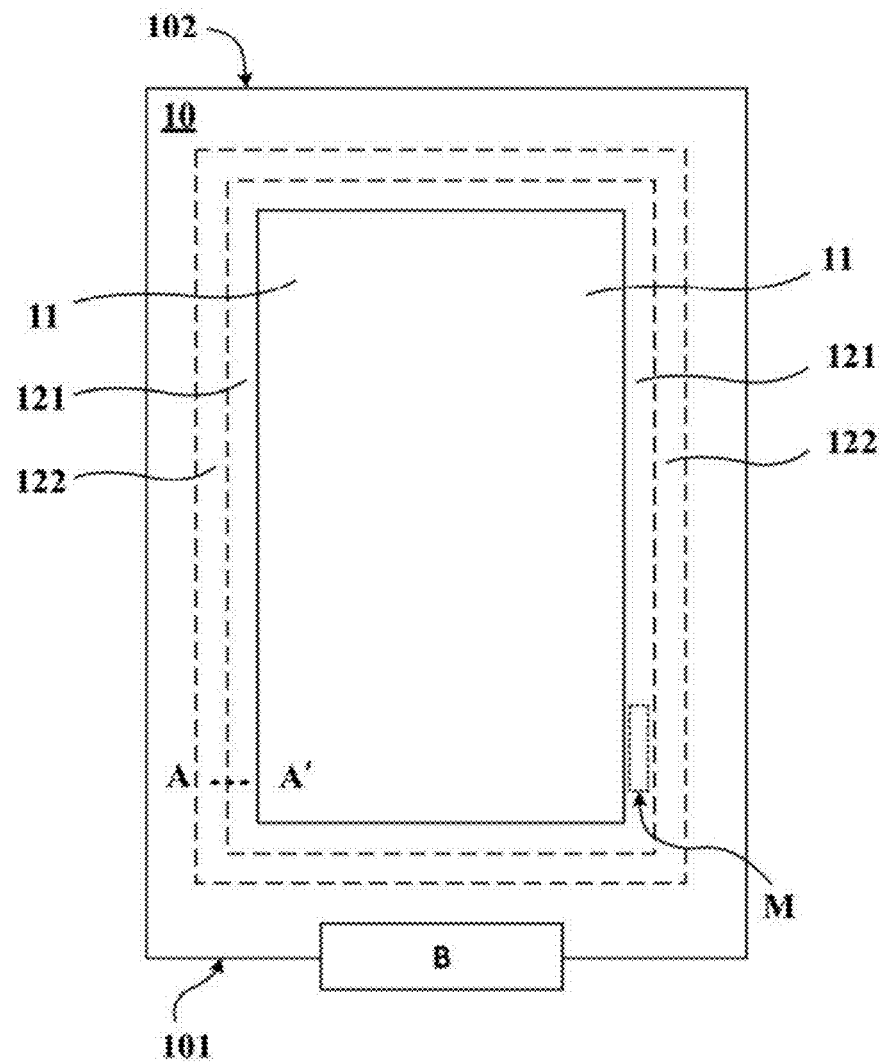
FIG. 1 is a schematic structural view of an organic electroluminescent device according to an embodiment of the disclosure.

FIG. 1 is a schematic structural view of an organic electroluminescent device according to an embodiment of the disclosure. As shown in FIG. 1, a substrate 10 includes a display area 11, an isolation area 121, a non-display area 122 and an integrated circuit wire bonding area B. The substrate 10 has a first side 101 and a second side 102 opposite to the first side 101. In the present embodiment, the first side 101 is one side close to the integrated circuit wire bonding area B, and the second side 102 is the other side far away from the integrated circuit wire bonding area B. The display area 11 is arranged on the substrate 10, the non-display area 122 is arranged at the periphery of the display area 11 on the substrate 10, and the isolation area 121 is arranged between the display area 11 and the non-display area 122. The isolation, area 121 further includes a first overlapping area, a, and the non-display area 122 further includes a second overlapping area 122a.

Figure 2:
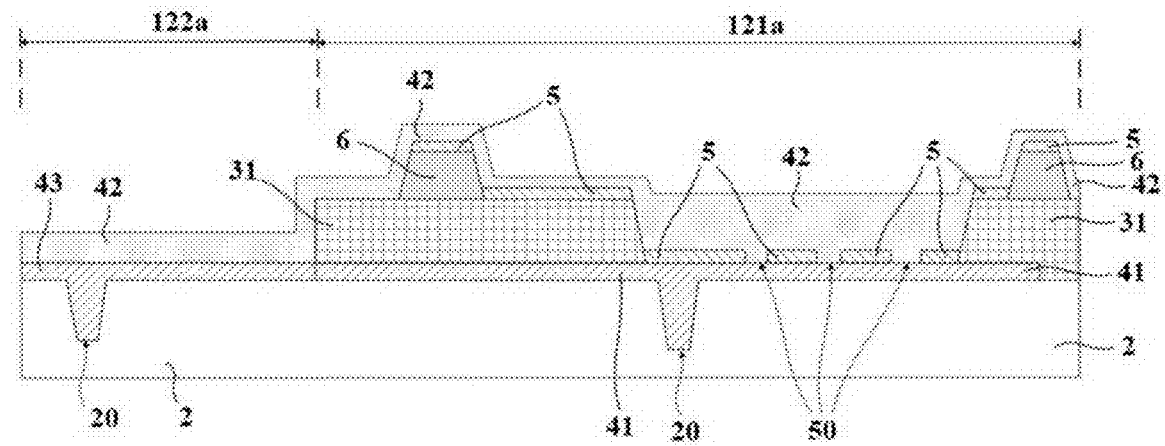
FIG. 2 is a cross-sectional view taken along the line A-A' of a structure of an organic electroluminescent device of a first embodiment of the disclosure.
Figure 3:
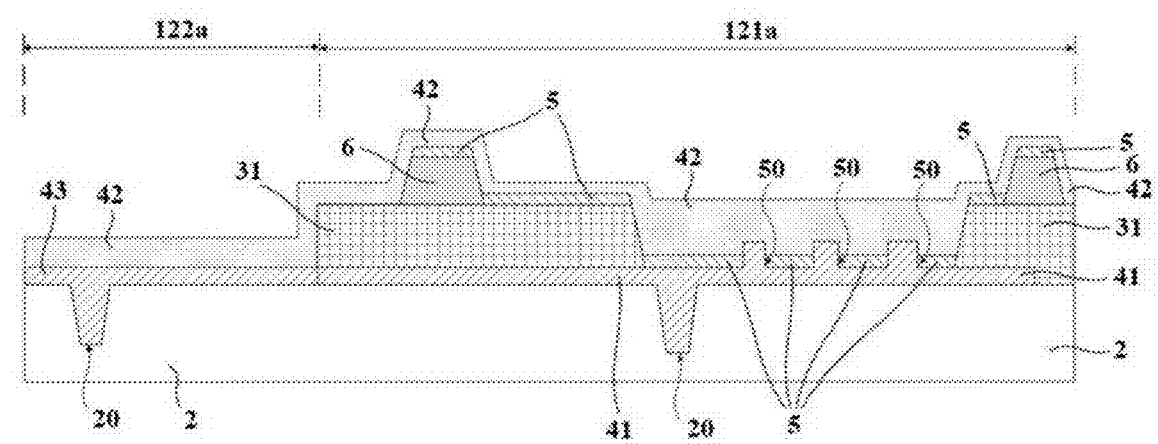
FIG. 3 is a cross-sectional view taken along the line A-A' of a structure of an organic electroluminescent device of a second embodiment of the disclosure.
Figure 4:
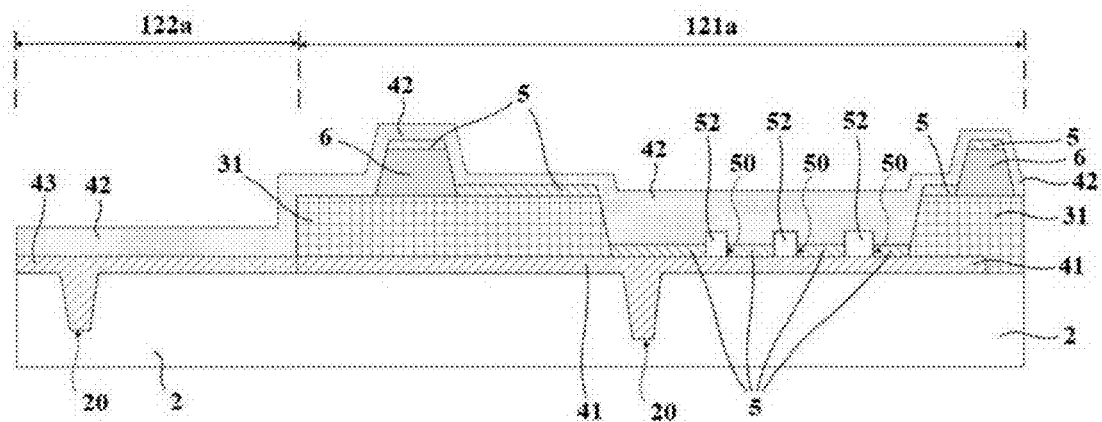
FIG. 4 is a cross-sectional view taken along the line A-A' of a structure of an organic electroluminescent device of a third embodiment of the disclosure.

FIG. 2 is a cross-sectional view taken along the line A-A' of a structure of an organic electroluminescent device of a first embodiment of the disclosure. FIG. 3 is a cross-sectional view taken along the line A-A' of a structure of an organic electroluminescent device of a second embodiment of the disclosure. FIG. 4 is a cross-sectional view taken along the line A-A' of a structure of an organic electroluminescent device of a third embodiment of the disclosure. The cross-sectional views taken along the line A-A' as shown in FIGS. 2 to 4 are cross-sectional views showing the second overlapping area 122a in the non-display area 122 to the first overlapping area 121a in the isolation area 121 in FIG. 1. As shown in FIGS. 2 to 4, the organic electroluminescent device of exemplary embodiments of the disclosure further includes a planarization layer 2, a pixel defining layer, a first electrode 41, a second electrode 42, a third electrode 43, an organic layer 5 and an isolation column 6. The planarization layer 2 is arranged on the substrate 10 and the pixel defining layer is arranged on the planarization layer 2. The pixel defining layer further includes a plurality of pixel defining blocks 31 for defining the display area 11 and the isolation area 121, and for defining the isolation area 121 and the non-display area 122. The first electrode 41 is formed on the planarization layer 2 in the isolation area 121, and the third electrode 43 is formed on the planarization layer 2 in the non-display area 122. The organic layer 5 is formed on the first electrode 41 in the isolation area 121. The second electrode 42 is formed on the pixel defining layer and the organic layer 5 in the isolation area 121. The first overlapping area 121a in the isolation area 121 includes the first electrode 41 formed in the isolation area 121 and the second electrode 42 overlapped with the first electrode 41 in the isolation area 121. The second overlapping area 122a in the non-display area 122 includes the third electrode 43 formed in the non-display area 122. In the second overlapping area 122a, the third electrode 43 is overlapped with the second electrode 42.

The following is a detailed description of the first embodiment shown in FIG. 2 as an example. In the second overlapping area 122a in the non-display area 122 of the present embodiment, the third electrode 43 is overlapped with the second electrode 42, and the first electrode 41 of the first overlapping area 121a in the isolation area 121 extends to the second overlapping area 122a in the non-display area 122 to form the third electrode 43, and at this time, the first electrode 41 and the third electrode 43 are formed integrally. When the pixel defining block 31 defines the isolation area 121 and the non-display area 122 herein, the pixel defining block 31 is correspondingly arranged on the first electrode 41 and/or the third electrode 43. As for such arrangement in the embodiment, when the current narrow bezel design reduces a space for the non-display area 122, the area of the first electrode 41 can be effectively increased, thereby compensating for the problem of insufficient overlapping area when designing the narrow bezel by making the overlapping area of the electrodes extend to the isolation area. In the embodiment, by means of increasing the area mentioned above, the parasitic resistance of the first electrode 41 achieves the effect of the reduced resistance by parallel connection. When the current flows, the problem of current attenuation can be further alleviated, and the uneven display defect of the organic electroluminescent display can be improved.

The planarization layer 2 further includes a plurality of grooves 20 in the isolation area 121 and the non-display area 122, so that the first electrode 41 and/or the third electrode 43 fill(s) the plurality of grooves 20. Since the first electrode 41 and the third electrode 43 are arranged on the planarization layer 2, when the first electrode 41 and/or the third electrode 43 fill(s) the plurality of grooves 20 in the planarization layer 2, the volume(s) of the first electrode 41 and/or the third electrode 43 is/are relatively increased, and the parasitic resistance is also relatively decreased after the parallel connection resulting in the added volume. In the embodiment, by means of increasing the volume mentioned above, the parasitic resistance of the first electrode 41 achieves the effect of the reduced resistance by parallel connection. When the current flows, the problem of current attenuation can be, further alleviated, and the uneven display defect of the organic electroluminescent display can be improved.

Continue referring to FIG. 2, the organic layer 5 further includes a plurality of openings 50 for providing the first electrode 41 overlapped with the second electrode 42. The plurality of openings 50 may be cylindrical, square cylindrical or tapered, but the disclosure is not limited thereto. In the first overlapping area 121a of the isolation area 121, the first electrode 41 is overlapped with the second electrode 42. The first electrode 41 is overlapped with and connected to the second electrode 42 by means of the superposed connection, which is also referred to as the overlapping connection. After the first electrode 41 is overlapped with the second electrode 42, an electrode layer is made having a larger area and a larger volume, by means of the overlapping connection, the parasitic resistance achieves the effect of the reduced resistance by parallel connection, thereby further alleviating the problem of current attenuation and improving the uneven defect of the organic electroluminescent display.

The difference between the second embodiment of FIG. 3 and the first embodiment of FIG. 2 is only the difference in the overlapping way by which the first electrode 41 is overlapped with the second electrode 42. In the first embodiment of FIG. 2, the second electrode 42 is overlapped with the first electrode 41 by passing through the opening 50 of the organic layer. In the second embodiment of FIG. 3, the first electrode 41 is overlapped with the second electrode 42 by passing through the opening 50 of the organic layer, and the structures of the remaining portions are the same which will not be described in detail here. Both overlapping ways having different structures aim to provide an electrode layer with a larger area or a larger volume, so that the parasitic resistance achieves the effect of the reduced resistance by parallel connection, thereby further alleviating the problem of current attenuation and improving the uneven defect of the organic electroluminescent display.

The difference between the third embodiment of FIG. 4 and the first embodiment of FIG. 2 and the second embodiment of FIG. 3 is only the difference in the overlapping way by which the first electrode 41 is overlapped with the second electrode 42. In the third embodiment of FIG. 4, a plurality of conductive pillars 52 are additionally included. As shown in FIG. 4, the plurality of conductive pillars 52 are arranged in the plurality of openings 50 of the organic layer 5 so that the first electrode 41 is overlapped with and in electrical communication with the second electrode 42, and the structures of the remaining portions are the same which will not be described in detail here. The plurality of conductive pillars 52 are overlapped with the first electrode 41, and the second electrode 42 are overlapped with the plurality of conductive pillars 52 to form a stack of three structures, so that the first electrode 41 is connected to and in electrical communication with the second electrode 42. The material for the plurality of conductive pillars 52 is a material which can make the first electrode 41 be in electrical communication with the second electrode 42, such as a metal or a silicon material which may be electrically conductive under the control, but the disclosure is not limited thereto. The overlapping way having different structures still aim to provide an electrode layer with a larger area or a larger volume, so that the parasitic resistance achieves the effect of the reduced resistance by parallel connection, thereby further alleviating the problem of current attenuation and improving the uneven defect of the organic electroluminescent display. The three different overlapping ways mentioned above can be achieved by the same or similar process technique.

Figure 5:
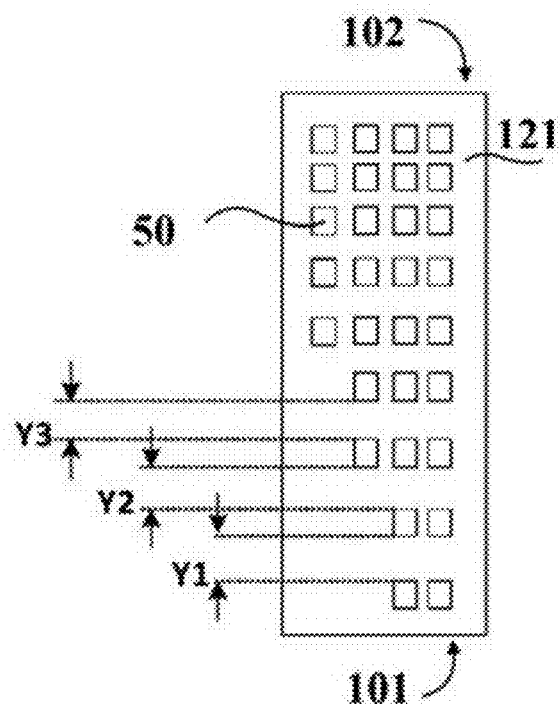
FIG. 5 is an enlarged schematic view of an isolation area of a structure of an organic electroluminescent device of a fourth embodiment of the disclosure.

FIG. 5 is an enlarged schematic view of an isolation area of a structure of an organic electroluminescent device of a fourth embodiment of the disclosure. FIG. 5 is an enlarged schematic view showing an M area of the first overlapping area 121a in the isolation area 121 of FIG. 1. As shown in the fourth embodiment of FIG. 5, a setting density of the plurality of openings 50 of the organic layer 5 is increased in the direction from the first side 101 of the substrate 10 toward the second side 102 of the substrate 10. There are less openings 50 in the organic layer 5 in the isolation area 121 close to the first side 101 of the substrate 10 and more openings 50 close to the second side 102 of the substrate 10, showing that the setting density of the openings 50 per unit area is increased from the first side 101 to the second side 102. The setting density described in the disclosure may also refer to a range existing in a unit area. As for the present embodiment, an increase in the setting density may indicate an increase in the range in which the opening 50 is present in the isolation region 121. The increase in the range in which the opening 50 is present will performs a similar function to the relative increase in the overlapping area of the openings. In the organic electroluminescent device of the disclosure, the overlapping area between the first electrode 41 and the second electrode 42 can be increased by means of increasing the setting density of the openings 50 from the first side 101 to the second side 102 mentioned above, so that the parasitic resistance of the first electrode 41 and the second electrode 42 achieves the effect of the reduced resistance by parallel connection, thereby further alleviating the problem of current attenuation and improving the uneven defect of the organic electroluminescent display.

As shown in FIG. 5, the spaced distance between the plurality of openings 50 is reduced in the direction from the first side 101 of the substrate 10 toward the second side 102 of the substrate 10. The spaced distances between the openings 50 in the direction perpendicular to the first side 101 are Y1, Y2, and Y3. In the embodiment, the length of the spaced distance Y3 is less than the length of the spaced distance Y2, and the length of the spaced distance Y2 is less than the length of the spaced distance Y1, showing that the spaced distance between the openings 50 is reduced in the direction from the first side 101 of the substrate 10 to the second side 102 of the substrate 10. The length of the spaced distance Y1, the length of the spaced distance Y2, and the length of the spaced distance Y3 may also be reduced in arithmetic progression. The organic electroluminescent device of the disclosure can achieve the effect of adding the number of openings 50 in the organic layer 5 by shortening the spaced distance between the openings 50 in the direction from the first side 101 to the second side 102, and the overlapping area between the first electrode 41 and the second electrode 42 is further increased, so that the parasitic resistance of the first electrode 41 and the second electrode 42 achieves the effect of the reduced resistance by parallel connection, thereby further alleviating the problem of current attenuation and improving the uneven defect of the organic electroluminescent display.

Figure 6:
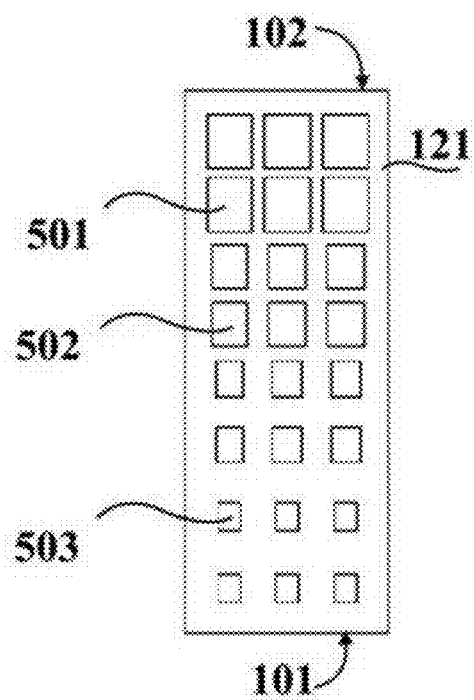
FIG. 6 is an enlarged schematic view of an isolation area of a structure of an organic electroluminescent device of a fifth embodiment of the disclosure.

FIG. 6 is an enlarged schematic view of an isolation area of a structure of an organic electroluminescent device of a fifth embodiment of the disclosure. FIG. 6 is an enlarged schematic view showing an M area of the first overlapping area 121a in the isolation area 121 of FIG. 1. As shown in the fifth embodiment of FIG. 6, the area of the plurality of openings 50 of the organic layer 5 is increased in the direction from the first side 101 of the substrate 10 toward the second side 102 of the substrate 10. The area of the opening 501 is larger than that of the opening 502, and the area of the opening 502 is larger than that of the opening 503, showing that the area of the opening 50 is increased in the direction from the first side 101 toward the second side 102. The organic electroluminescent device of the disclosure can further increase the overlapping area between the first electrode 41 and the second electrode 42 by means of increasing the area of the openings 50 from the first side 101 toward the second side 102, so that the parasitic resistance of the first electrode 41 and the second electrode 42 achieves the effect of the reduced resistance by parallel connection, thereby further alleviating the problem of current attenuation and improving the uneven defect of the organic electroluminescent display.

In the embodiment of the disclosure, the effect of increasing the volume of the electrode layer can also be achieved by changing the film thickness of the second electrode 42 in the isolation area 121. The film thickness of the second electrode 42 in the isolation area 121 is increased in the direction from the first side 101 of the substrate 10 to the second side 102 of the substrate 10, so that the parasitic resistance of the second electrode 42 achieves the effect of the reduced resistance, thereby further alleviating the problem of current attenuation and improving the uneven defect of the organic electroluminescent display.

Based on this, exemplary embodiments of the disclosure further propose an organic electroluminescent display, including a flexible printed circuit board (FPC) and a power supply interface, and the organic electroluminescent display uses the aforementioned organic electroluminescent device. At the same time, a mobile communication device is proposed, including a communication device and a display device, and the display device is the aforementioned organic electroluminescence display.

It should also be noted that the terms "including", "comprising" or any other variations thereof are intended to encompass a non-exclusive inclusion, such that an item or system comprising a series of elements includes not only those elements but also other elements not specifically listed, or elements that are inherent to such item or system. In the case without more limitations, an element defined by the phrase "comprising a . . . " does not exclude that additional identical elements are present in the item or system including the element.

The above description shows and describes several preferred embodiments of the disclosure. However, as described before, it should be understood that the disclosure is not limited to the forms disclosed herein, and should not be construed as an exclusion to the other embodiments, other combinations, modifications, and environments are possible which can be modified based on the above teachings or the related technologies or knowledge within the scope of the concept described herein. All changes and modifications made by a person skilled in the art are intended to be within the scope of the appended claims of the disclosure without departing from the spirit and the scope of the disclosure.

What is claimed is:

1. An organic electroluminescent device, comprising:
   a display area;
   a non-display area located at the periphery of the display area;
   an isolation area located between the display area and the non-display area and having a first overlapping area;
   a first electrode located in the isolation area;
   a second electrode overlapped with the first electrode,
   wherein the isolation area is located at a periphery of the display area, and the first electrode is overlapped with the second electrode in the first overlapping area of the isolation area;
   wherein the organic electroluminescent device further comprises a substrate, the substrate has a first side and a second side opposite to the first side; a film thickness of the second electrode in the isolation area is increased in the direction from the first side of the substrate to the second side of the substrate of the organic electroluminescent display.

2. The organic electroluminescent device according to claim 1, wherein the organic electroluminescent device further comprises a third electrode, the non-display area comprises a second overlapping area, and the third electrode is overlapped with the second electrode in the second overlapping area.

3. The organic electroluminescent device according to claim 2, wherein the third electrode in the second overlapping area is formed by making the first electrode in the isolation area extend toward the non-display area.

4. The organic electroluminescent device according to claim 3, wherein the organic electroluminescent device further comprises a planarization layer arranged on the substrate, and the first electrode and the third electrode are formed on the planarization layer.

5. The organic electroluminescent device according to claim 4, wherein the organic electroluminescent device further comprises a pixel defining layer arranged on the planarization layer and the pixel defining layer further comprises a plurality of pixel defining blocks for defining the display area and the isolation area, and for defining the isolation area and the non-display area.

6. The organic electroluminescent device according to claim 5, wherein the organic electroluminescent device further comprises an organic layer formed on the first electrode.

7. The organic electroluminescent device according to claim 6, wherein the organic electroluminescent device further comprises an isolation column arranged on the pixel defining layer, and the second electrode covers the isolation column.

8. The organic electroluminescent device according to claim 6, wherein the organic layer has a plurality of openings, and the first electrode is in electrical communication with the second electrode via the opening; the first side is one side close to an integrated circuit wire bonding area of the substrate, and the second side is the other side far away from the integrated circuit wire bonding area of the substrate.

9. The organic electroluminescent device according to claim 8, wherein the organic electroluminescent device further comprises a plurality of conductive pillars arranged in the plurality of openings, the plurality of conductive pillars are overlapped with the first electrode, and the second electrode are overlapped with the plurality of conductive pillars.

10. The organic electroluminescent device according to claim 8, wherein a setting density of the plurality of openings in the organic layer is increased in the direction from the first side of the substrate toward the second side of the substrate.

11. The organic electroluminescent device according to claim 8, wherein a spaced distance between the plurality of openings is reduced in the direction from the first side of the substrate toward the second side of the substrate.

12. The organic electroluminescent device according to claim 8, wherein an area of the plurality of openings in the organic layer is increased in the direction from the first side of the substrate toward the second side of the substrate.

13. The organic electroluminescent device according to claim 6, wherein, the organic layer has a plurality of openings, the second electrode is overlapped with the first electrode by passing through the opening of the organic.

14. The organic electroluminescent device according to claim 6, wherein, the organic layer has a plurality of openings, the first electrode is overlapped with the second electrode by passing through the opening of the organic.

15. The organic electroluminescent device according to claim 4, wherein the planarization layer comprises a plurality of grooves in the isolation area and/or the non-display area, the first electrode or the third electrode fills the grooves, or the first electrode and the third electrode fill the grooves.

16. The organic electroluminescent device according to claim 2, wherein, a combination of the first electrode and the third electrode extends across both the isolation area and the non-display area.

17. The organic electroluminescent device according to claim 1, wherein the first side is one side close to an integrated circuit wire bonding area of the substrate, and the second side is the other side far away from the integrated circuit wire bonding area of the substrate.

18. The organic electroluminescent device according to claim 1, wherein, the organic electroluminescent device further comprises an organic layer formed on the first electrode, and the first electrode connects with the second electrode in isolation area through the organic layer.

19. An organic electroluminescence display comprising a flexible printed circuit board and a power supply interface, and further comprising an organic electroluminescent device comprising a display area; a non-display area located at the periphery of the display area; an isolation area located between the display area and the non-display area and having a first overlapping area; a first electrode located in the isolation area; a second electrode overlapped with the first electrode, wherein the isolation area is located at a periphery of the display area, and the first electrode is overlapped with the second electrode in the first overlapping area of the isolation area; wherein the organic electroluminescent device further comprises a substrate, the substrate has a first side and a second side opposite to the first side; a film thickness of the second electrode in the isolation area is increased in the direction from the first side of the substrate to the second side of the substrate of the organic electroluminescent display.

20. A mobile communication device comprising a communication device and a display device, the display device being the organic electroluminescent display, the organic electroluminescence display comprising a flexible printed circuit board and a power supply interface, and further comprising an organic electroluminescent device comprising a display area; a non-display area located at the periphery of the display area; an isolation area located between the display area and the non-display area and having a first overlapping area; a first electrode located in the isolation area; a second electrode overlapped with the first electrode wherein the isolation area is located at a periphery of the display area, and the first electrode is overlapped with the second electrode in the first overlapping area of the isolation area; wherein the organic electroluminescent device further comprises a substrate, the substrate has a first side and a second side opposite to the first side; a film thickness of the second electrode in the isolation area is increased in the direction from the first side of the substrate to the second side of the substrate of the organic electroluminescent display.

* * * * *